(12) United States Patent
Takuma

(10) Patent No.: US 11,581,887 B2
(45) Date of Patent: Feb. 14, 2023

(54) OVERCURRENT PROTECTION CIRCUIT

(71) Applicant: ROHM Co., LTD., Kyoto (JP)

(72) Inventor: Toru Takuma, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/197,312

(22) Filed: Mar. 10, 2021

(65) Prior Publication Data

US 2021/0288637 A1    Sep. 16, 2021

(30) Foreign Application Priority Data

Mar. 16, 2020   (JP) .............................. JP2020-045498

(51) Int. Cl.
*H03K 17/082* (2006.01)
*H02H 9/02* (2006.01)
*B60R 16/02* (2006.01)

(52) U.S. Cl.
CPC ......... *H03K 17/0822* (2013.01); *H02H 9/025* (2013.01); *B60R 16/02* (2013.01)

(58) Field of Classification Search
CPC ...... H02H 9/02; H02H 9/025; H03K 17/0822; H03K 17/08–0828
See application file for complete search history.

(56) References Cited

U.S. PATENT DOCUMENTS

| | | | |
|---|---|---|---|
| 2014/0247523 A1* | 9/2014 | Kawano | H02M 3/158 361/18 |
| 2018/0041111 A1* | 2/2018 | Chan | H02M 1/32 |
| 2019/0190512 A1* | 6/2019 | Takuma | H02H 9/025 |
| 2022/0094348 A1* | 3/2022 | Gaudenz | H03K 17/0822 |

OTHER PUBLICATIONS

EP 19157443.3. Feb. 15, 2019. (Year: 2019).*

* cited by examiner

*Primary Examiner* — Jared Fureman
*Assistant Examiner* — Christopher J Clark
(74) *Attorney, Agent, or Firm* — Chip Law Group

(57) ABSTRACT

Disclosed herein is an overcurrent protection circuit configured to, upon detection of an output current that flows through a switch element reaching a first overcurrent limit value, reduce an overcurrent limit value for the output current from the first overcurrent limit value to a second overcurrent limit value smaller than the first overcurrent limit value.

7 Claims, 11 Drawing Sheets

OVERCURRENT PROTECTION CIRCUIT

CROSS REFERENCE TO RELATED APPLICATIONS

This application claims priority benefit of Japanese Patent Application No. JP 2020-045498 filed in the Japan Patent Office on Mar. 16, 2020. Each of the above-referenced applications is hereby incorporated herein by reference in its entirety.

BACKGROUND

The technology disclosed herein relates to an overcurrent protection circuit.

The applicant of the present application has proposed a number of novel techniques concerning switch devices, such as in-vehicle intelligent power devices (IPDs) (see, for example, WO 2017/187785).

SUMMARY

However, switch devices in the related art have room for further improvement in an overcurrent protection function (e.g., combining securing of an instantaneous current at start-up and a safety design for a time of output limiting).

In view of the above problem found by the inventors of the present application, it is desirable to provide an overcurrent protection circuit that is able to combine securing of an instantaneous current at start-up and a safety design for the time of output limiting.

An overcurrent protection circuit according to an embodiment of the present disclosure is configured to, upon detection of an output current that flows through a switch element reaching a first overcurrent limit value, reduce an overcurrent limit value for the output current from the first overcurrent limit value to a second overcurrent limit value smaller than the first overcurrent limit value (a first configuration).

The overcurrent protection circuit having the above first configuration may be further configured to, upon detection of the output current reaching the first overcurrent limit value, reduce a rate of rise of the output current when the switch element transitions to an ON state, from a first rate of rise to a second rate of rise lower than the first rate of rise (a second configuration).

The overcurrent protection circuit having the above first or second configuration may be further configured to, upon detection of the output current reaching the first overcurrent limit value, start hiccup driving of the switch element (a third configuration).

The overcurrent protection circuit having the above third configuration may include an overcurrent detection section configured to detect whether or not the output current is greater than the overcurrent limit value to limit the output current to the overcurrent limit value or lower, and a hiccup control section configured to perform the hiccup driving on the switch element on the basis of a result of the detection by the overcurrent detection section (a fourth configuration).

In the overcurrent protection circuit having the above fourth configuration, the overcurrent detection section may control a drive signal for the switch element according to a result of comparing the output current with the overcurrent limit value (a fifth configuration).

In the overcurrent protection circuit having the above fourth or fifth configuration, the hiccup control section may control a drive signal for the switch element such that a predetermined ON period and a predetermined OFF period will be repeated (a sixth configuration).

A switch device according to an embodiment of the present disclosure includes a switch element, and an overcurrent protection circuit having any one of the above first to sixth configurations, and configured to monitor an output current that flows through the switch element (a seventh configuration).

An electronic device according to an embodiment of the present disclosure includes a switch device having the above seventh configuration, and a load connected to the switch device (an eighth configuration).

In the electronic device having the above eighth configuration, the load may be one of a valve lamp, a relay coil, a solenoid, a light-emitting diode, and a motor (a ninth configuration).

A vehicle according to an embodiment of the present disclosure includes an electronic device having one of the above eighth and ninth configurations (a tenth configuration).

According to an embodiment of the present technology disclosed herein, an overcurrent protection circuit that is able to combine securing of an instantaneous current at start-up and a safety design for a time of output limiting can be provided.

DETAILED DESCRIPTION OF THE PREFERRED EMBODIMENT

<Semiconductor Integrated Circuit Device (Basic Configuration)>

Figure 1:
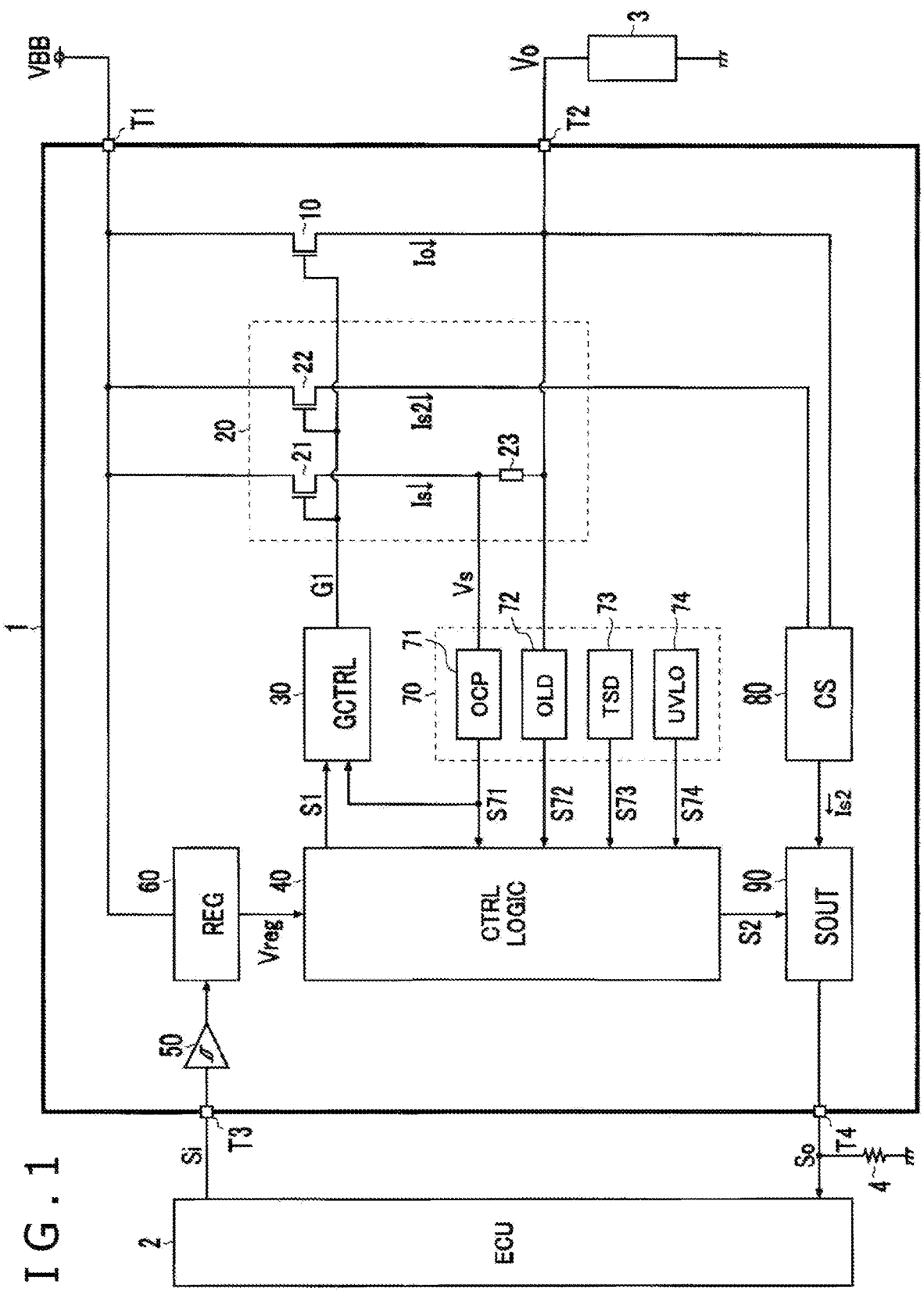
FIG. 1 is a diagram illustrating a basic configuration of a semiconductor integrated circuit device.

FIG. 1 is a diagram illustrating a basic configuration of a semiconductor integrated circuit device 1. The semiconductor integrated circuit device 1 having this example configuration is an in-vehicle high-side switch large-scale integration (LSI) (i.e., a type of in-vehicle IPD) that establishes and cuts off an electrical connection between a load 3 and an application terminal for a power supply voltage VBB according to an instruction from an electronic control unit (ECU) 2.

The semiconductor integrated circuit device 1 is provided with external terminals T1, T2, T3, and T4 as means for establishing an electrical connection with an external entity. The external terminal T1 is a power supply terminal (VBB pin) for accepting supply of the power supply voltage VBB (e.g., 12 V) from a battery (not depicted). The external terminal T2 is a load connection terminal or an output terminal (OUT pin) to allow external connection of the load 3 (e.g., a valve lamp, a relay coil, a solenoid, a light-emitting diode, a motor, or other loads). The external terminal T3 is a signal input terminal (IN pin) for accepting an external input of an external control signal Si from the ECU 2. The external terminal T4 is a signal output terminal (SENSE pin) for externally outputting a state notification signal So to the ECU 2. Note that an external sense resistor 4 is externally connected between the external terminal T4 and a ground terminal.

The semiconductor integrated circuit device 1 has integrated therein an N-type metal-oxide-semiconductor field-effect transistor (NMOSFET) 10, an output current monitoring section 20, a gate control section 30, a control logic section 40, a signal input section 50, an internal power supply section 60, an abnormality protection section 70, an output current sensing section 80, and a signal output section 90.

The NMOSFET 10 is a power transistor having a high withstand voltage (e.g., a withstand voltage of 42 V) and having a drain connected to the external terminal T1 and a source connected to the external terminal T2. The NMOSFET 10 thus connected functions as a switch element (i.e., a high-side switch) for establishing and cutting off an electrical connection over a current path leading from the application terminal for the power supply voltage VBB to a ground terminal through the load 3. The NMOSFET 10 is on when a gate drive signal G1 is at a high level, and is off when the gate drive signal G1 is at a low level.

The NMOSFET 10 may be designed such that an ON resistance Ron thereof is some tens of mΩ. Note that, as the ON resistance Ron of the NMOSFET 10 is lower, a flow of an overcurrent is more likely to occur, leading to abnormal generation of heat, when a ground fault (i.e., a fault of a short to the ground terminal or to a comparable low-potential terminal) occurs at the external terminal T2. Therefore, an overcurrent protection circuit 71 and a temperature protection circuit 73, which will be described below, become more important as the ON resistance Ron of the NMOSFET 10 is decreased.

The output current monitoring section 20 includes NMOSFETs 21 and 22 and a sense resistor 23, and generates a sense voltage Vs (corresponding to a sense signal) according to an output current Io that flows through the NMOSFET 10.

The NMOSFETs 21 and 22 are each a mirror transistor connected in parallel with the NMOSFET 10 and generate sense currents Is and Is2, respectively, according to the output current Io. The size ratio between the NMOSFET 10 and the NMOSFETs 21 and 22 is m:1 (m>1). Therefore, each of the sense currents Is and Is2 has a value equal to that of the output current Io multiplied by 1/m. Similarly to the NMOSFET 10, each of the NMOSFETs 21 and 22 is on when the gate drive signal G1 is at the high level, and is off when the gate drive signal G1 is at the low level.

The sense resistor 23 (resistance value: Rs) is connected between a source of the NMOSFET 21 and the external terminal T2, and is a current/voltage conversion element for generating the sense voltage Vs (=Is×Rs+Vo, where Vo denotes an output voltage that appears at the external terminal T2) according to the sense current Is.

The gate control section 30 generates the gate drive signal G1 with increased current capability compared to a gate control signal S1 and outputs the generated gate drive signal G1 to a gate of the NMOSFET 10 (and gates of the NMOSFETs 21 and 22), thereby performing on/off control on the NMOSFET 10. The gate control section 30 has a function of controlling the NMOSFET 10 so as to limit the output current Io according to an overcurrent protection signal S71.

The control logic section 40 generates the gate control signal S1, receiving supply of an internal power supply voltage Vreg. For example, when the external control signal Si is at a high level (i.e., a logic level when the NMOSFET 10 is turned on), the internal power supply voltage Vreg is supplied from the internal power supply section 60, and accordingly, the control logic section 40 enters an operating state, causing the gate control signal S1 to be at a high level (=Vreg). Meanwhile, when the external control signal Si is at a low level (i.e., a logic level when the NMOSFET 10 is turned off), the internal power supply voltage Vreg is not supplied from the internal power supply section 60, and accordingly, the control logic section 40 enters a non-operating state, causing the gate control signal S1 to be at a low level (=GND). In addition, the control logic section 40 monitors various types of abnormality protection signals (e.g., the overcurrent protection signal S71, an open protection signal S72, a temperature protection signal S73, and a voltage reduction protection signal S74). The control logic section 40 additionally has a function of generating an output switch signal S2 according to respective results of monitoring of the overcurrent protection signal S71, the open protection signal S72, and the temperature protection signal S73 out of the above-mentioned abnormality protection signals.

The signal input section 50 is a Schmitt trigger that accepts an input of the external control signal Si from the external terminal T3 and transfers the input to the internal power supply section 60 and the control logic section 40. The external control signal Si is at the high level when the NMOSFET 10 is turned on, and is at the low level when the NMOSFET 10 is turned off, for example.

The internal power supply section 60 generates a predetermined internal power supply voltage Vreg from the power supply voltage VBB and supplies the internal power supply voltage Vreg to various sections of the semiconductor integrated circuit device 1. The internal power supply section 60 is controlled to operate or not to operate according to the external control signal Si. More specifically, the internal power supply section 60 is in an operating state when the external control signal Si is at the high level, and is in a non-operating state when the external control signal Si is at the low level.

The abnormality protection section 70 is a circuit block for detecting various abnormalities in the semiconductor integrated circuit device 1, and includes the overcurrent protection circuit 71, an open protection circuit 72, the temperature protection circuit 73, and a voltage reduction protection circuit 74.

The overcurrent protection circuit 71 generates the overcurrent protection signal S71 according to a result of monitoring the sense voltage Vs (i.e., whether or not an overcurrent abnormality has occurred in the output current Io). The overcurrent protection signal S71 is at a low level when an abnormality has not been detected, and is at a high level when an abnormality has been detected, for example.

The open protection circuit 72 generates the open protection signal S72 according to a result of monitoring the output voltage Vo (i.e., whether or not an open abnormality has occurred in the load 3). The open protection signal S72 is at a low level when an abnormality has not been detected, and is at a high level when an abnormality has been detected, for example.

The temperature protection circuit 73 includes a temperature sensing element (not depicted) for detecting an abnormal generation of heat in the semiconductor integrated circuit device 1 (in particular, around the NMOSFET 10) and generates the temperature protection signal S73 according to a result of this detection (i.e., whether or not an abnormal generation of heat has occurred). The temperature protection signal S73 is at a low level when an abnormality has not been detected, and is at a high level when an abnormality has been detected, for example.

The voltage reduction protection circuit 74 generates the voltage reduction protection signal S74 according to a result of monitoring the power supply voltage VBB or the internal power supply voltage Vreg (i.e., whether or not a voltage reduction abnormality has occurred). The voltage reduction protection signal S74 is at a low level when an abnormality has not been detected, and is at a high level when an abnormality has been detected, for example.

The output current sensing section 80 causes a source voltage of the NMOSFET 22 to coincide with the output voltage Vo using bias means (not depicted), and thereby generates the sense current Is2 (=Io/m) according to the output current Io and outputs the generated sense current Is2 to the signal output section 90.

The signal output section 90 selectively outputs one of the sense current Is2 (corresponding to a result of sensing the output current Io) and a fixed voltage V90 (corresponding to an abnormality flag, which is not explicitly depicted in the figure) to the external terminal T4 on the basis of the output switch signal S2. In a case where the sense current Is2 has been selected and outputted, an output sensing voltage V80 (=Is2×R4) obtained by current/voltage conversion of the sense current Is2 by the external sense resistor 4 (resistance value: R4) is transferred, as the state notification signal So, to the ECU 2. The output sensing voltage V80 increases as the output current Io increases, and decreases as the output current Io decreases. Meanwhile, in a case where the fixed voltage V90 has been selected and outputted, the fixed voltage V90 is transferred, as the state notification signal So, to the ECU 2. In a case where the current value of the output current Io is read from the state notification signal So, it is sufficient if the state notification signal So is subjected to analog-to-digital (A/D) conversion to accomplish this. Meanwhile, in a case where the abnormality flag is read from the state notification signal So, it is sufficient if a logic level of the state notification signal So is determined using a threshold value slightly lower than the value of the fixed voltage V90.

<Gate Control Section>

Figure 2:
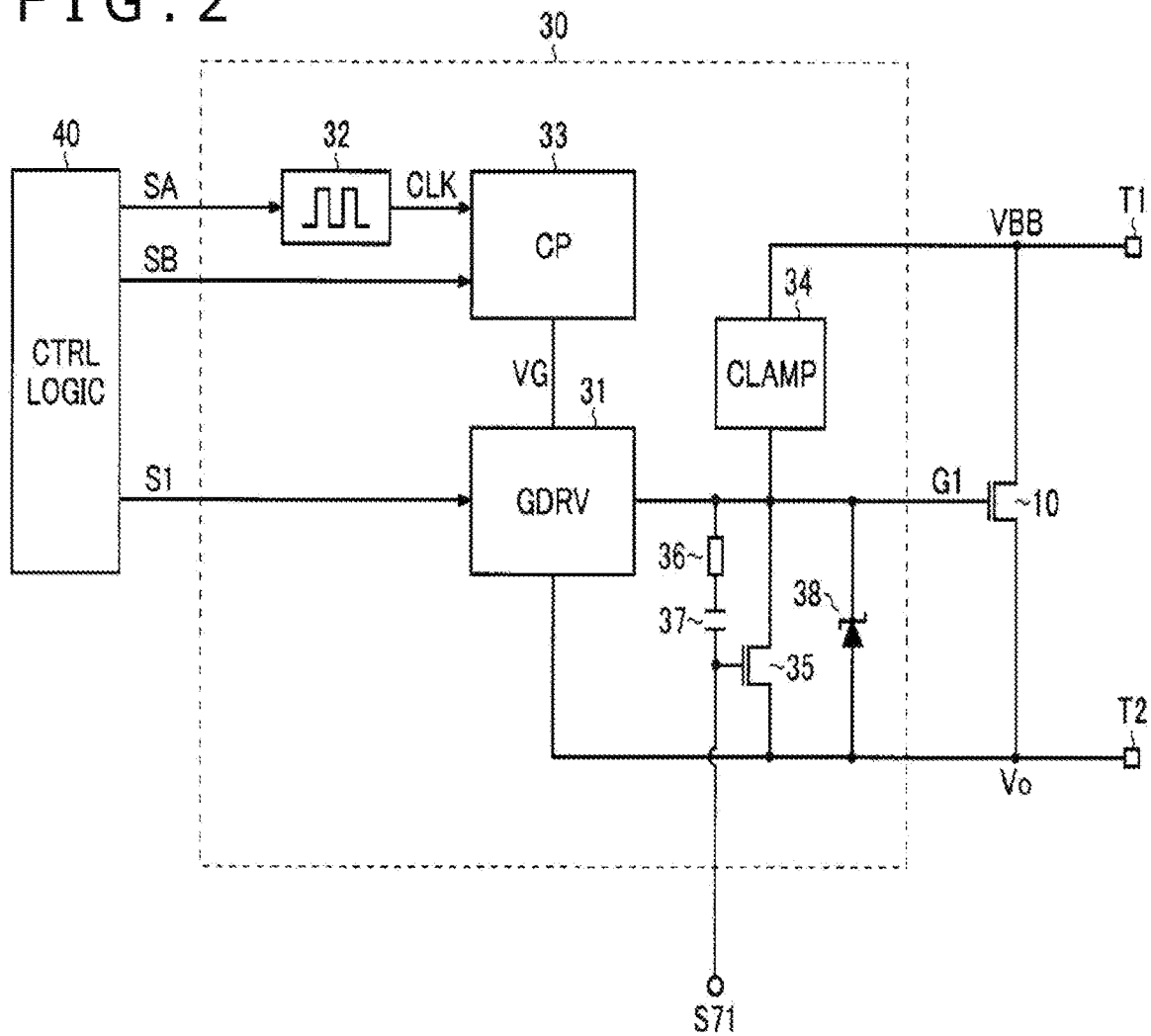
FIG. 2 is a diagram illustrating an example configuration of a gate control section.

FIG. 2 is a diagram illustrating an example configuration of the gate control section 30. In FIG. 2, the gate control section 30 includes a gate driver 31, an oscillator 32, a charge pump 33, a clamper 34, an NMOSFET 35, a resistor 36 (resistance value: R36), a capacitor 37 (capacitance value: C37), and a Zener diode 38.

The gate driver 31 is connected between the external terminal T2 (i.e., an application terminal for the output voltage Vo) and an output terminal (i.e., an application terminal for a stepped-up voltage VG) of the charge pump 33, and generates the gate drive signal G1 with increased current capability compared to the gate control signal S1. The gate drive signal G1 is at the high level (=VG) when the gate control signal S1 is at the high level, and is at the low level (=Vo) when the gate control signal S1 is at the low level.

The oscillator 32 generates a clock signal CLK having a predetermined frequency and outputs the generated clock signal CLK to the charge pump 33. The oscillator 32 is controlled to operate or not to operate according to an enable signal SA from the control logic section 40.

The charge pump 33 is an example of a step-up section that drives a flying capacitor using the clock signal CLK, and thereby generates the stepped-up voltage VG, which is higher than the power supply voltage VBB, and supplies the generated stepped-up voltage VG to the gate driver 31. The charge pump 33 is controlled to operate or not to operate according to an enable signal SB from the control logic section 40.

The clamper 34 is connected between the external terminal T1 (i.e., the application terminal for the power supply voltage VBB) and the gate of the NMOSFET 10. In an application in which an inductive load 3 is connected to the external terminal T2, a counter-electromotive force of the load 3 may cause the output voltage Vo to be a negative voltage (<GND) when the state of the NMOSFET 10 is switched from ON to OFF. Accordingly, the clamper 34 (i.e., what is called an active clamp circuit) is provided for energy absorption.

A drain of the NMOSFET 35 is connected to the gate of the NMOSFET 10. A source of the NMOSFET 35 is connected to the external terminal T2. A gate of the NMOSFET 35 is connected to an application terminal for the overcurrent protection signal S71. The resistor 36 and the capacitor 37 are connected in series between the drain and the gate of the NMOSFET 35.

A cathode of the Zener diode 38 is connected to the gate of the NMOSFET 10. An anode of the Zener diode 38 is connected to the source of the NMOSFET 10. The Zener diode 38 thus connected functions as a clamp element for limiting a gate-source voltage (=VG−Vo) of the NMOSFET 10 to a predetermined value or lower.

In the gate control section 30 having this example configuration, if the overcurrent protection signal S71 makes a transition to the high level, the gate drive signal G1 is caused to decrease in level from the high level (=VG) in a steady state with a predetermined time constant τ (=R36×C37). As a result, the degree of conduction of the NMOSFET 10 gradually decreases, limiting the output current Io. Meanwhile, if the overcurrent protection signal S71 makes a transition to the low level, the gate drive signal G1 is caused to increase in level with the predetermined time constant τ.

As a result, the degree of conduction of the NMOSFET 10 gradually increases, removing the limitation on the output current Io.

As described above, the gate control section 30 having this example configuration has a function of controlling the gate drive signal G1 so as to limit the output current Io according to the overcurrent protection signal S71.

<Consideration Concerning Overcurrent Protection Operations>

In General, overcurrent protection operations can be broadly classified into three types, that is, (1) a current limiting operation, (2) a hiccup operation, and (3) an off-latch operation.

Figure 3:
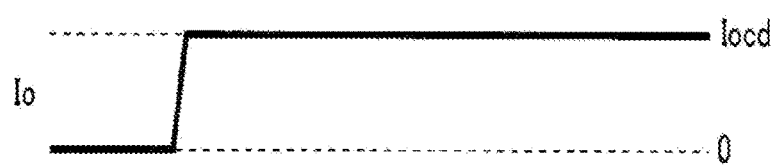
FIG. 3 is a diagram illustrating a first example (i.e., a current limiting operation) of an overcurrent protection operation.

FIG. 3 is a diagram illustrating a first example (i.e., a current limiting operation) of an overcurrent protection operation. As illustrated in this figure, when the output current Io has entered an overcurrent state, the current limiting operation limits the output current Io to a predetermined overcurrent limit value Iocd or lower by increasing the ON resistance Ron of the NMOSFET 10.

Figure 4:
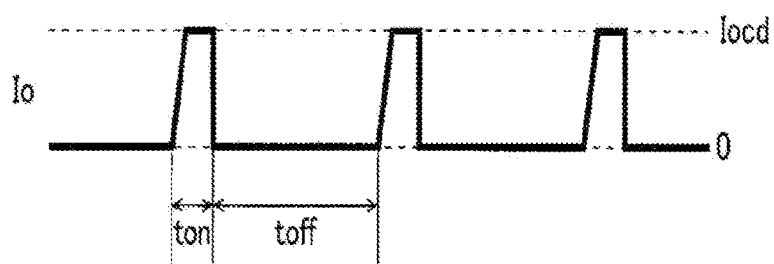
FIG. 4 is a diagram illustrating a second example (i.e., a hiccup operation) of the overcurrent protection operation.

FIG. 4 is a diagram illustrating a second example (i.e., a hiccup operation) of the overcurrent protection operation. As illustrated in this figure, when the output current Io has entered an overcurrent state, the hiccup operation performs hiccup driving (i.e., intermittent driving that initiates periodic switching between an ON state and an OFF state) on the NMOSFET 10 such that a predetermined ON period ton and a predetermined OFF period toff will be repeated. This hiccup operation is effective particularly in a case where the inductive load 3 (e.g., a solenoid coil, a relay coil, or other loads) is connected.

Figure 5:
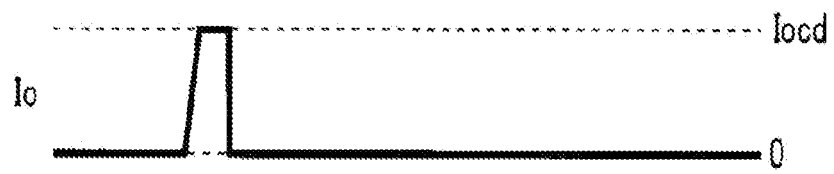
FIG. 5 is a diagram illustrating a third example (i.e., an off-latch operation) of the overcurrent protection operation.

FIG. 5 is a diagram illustrating a third example (i.e., an off-latch operation) of the overcurrent protection operation. As illustrated in this figure, the off-latch operation forcibly turns off the NMOSFET 10 when the output current Io has entered an overcurrent state. Note that, once the off-latch operation is completed, the NMOSFET 10 is kept in the OFF state until the semiconductor integrated circuit device 1 is restarted.

Of the above-described three types of overcurrent protection operations, the hiccup operation (FIG. 4), which periodically turns on and off the output current Io, is able to more effectively limit an increase in temperature of the semiconductor integrated circuit device 1 (in particular, of the NMOSFET 10) during the overcurrent protection operation than the current limiting operation (FIG. 3), which allows the output current Io to continue to flow.

In particular, in the semiconductor integrated circuit device 1, which is presumably used in a major part (e.g., an engine, a transmission, or other parts which will be in a high-temperature state) of a vehicle, the above-described hiccup operation is preferred to prevent an overheated state during the overcurrent protection operation.

Here, the overcurrent limit value Iocd is uniquely fixed in a hiccup operation in the related art. For example, in a case where a large value (e.g., the value of a maximum rated current of the semiconductor integrated circuit device 1) is set as the overcurrent limit value Iocd, a maximum possible value of the output current Io that flows through the NMOSFET 10 is large, and therefore, an inrush current that flows when a capacitive load (e.g., a valve lamp) is activated can be permitted. However, because there is a large divergence between a normal value of the output current Io and the overcurrent limit value Iocd, this design may not necessarily be called a safety design. In particular, the above-described hiccup operation is continued as long as the output current Io continues to be in the overcurrent state. Therefore, the hiccup operation may fail to prevent an overheated state depending on the ON resistance Ron of the NMOSFET 10 or thermal resistance of a package.

Meanwhile, in a case where a small value is set as the overcurrent limit value Iocd, a high level of safety of a set can be ensured, but an inrush current at start-up or other currents may not be permitted. This will limit the type of the load 3 that can be connected to the semiconductor integrated circuit device 1, resulting in reduced versatility of the semiconductor integrated circuit device 1.

In addition, when the operation (e.g., the above-described hiccup operation) for limiting the output current Io is performed, a transient peak current Ipeak also needs to be taken into consideration.

Figure 6:
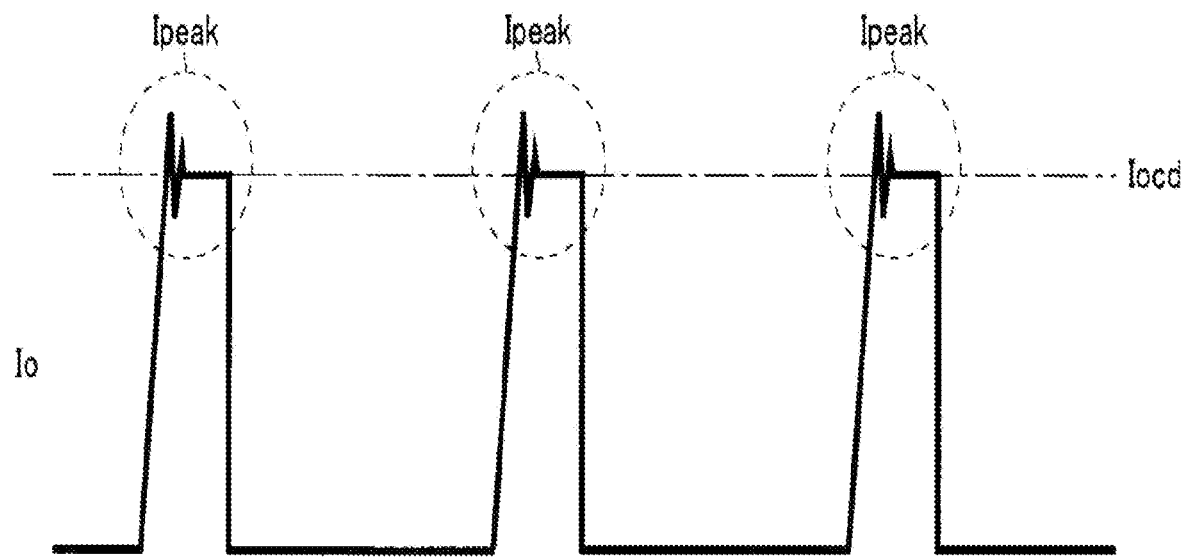
FIG. 6 is a diagram illustrating how peak currents occur when the hiccup operation is performed.

FIG. 6 is a diagram illustrating how peak currents Ipeak occur when the hiccup operation is performed. As illustrated in this figure, in the overcurrent protection operation (in this figure, the hiccup operation) performed by the overcurrent protection circuit 71, a peak current Ipeak having a value greater than the overcurrent limit value Iocd may transiently occur as the output current Io. Note that the magnitude of the peak current Ipeak depends on, for example, the magnitude of the overcurrent limit value Iocd, responsiveness of the circuit, the rate of rise (i.e., slew rate) of the output current Io, or an impedance component or an inductance component that accompanies the NMOSFET 10.

In particular, when the output current Io sharply increases, such as when a ground fault has occurred at the external terminal T2, the peak current Ipeak tends to easily become large. As the value of the peak current Iocd relative to the overcurrent limit value Iocd increases, a change in current per unit time is greater. Such a change in current may, as a noise component, exert a harmful effect on various parts of the set.

Figure 7:
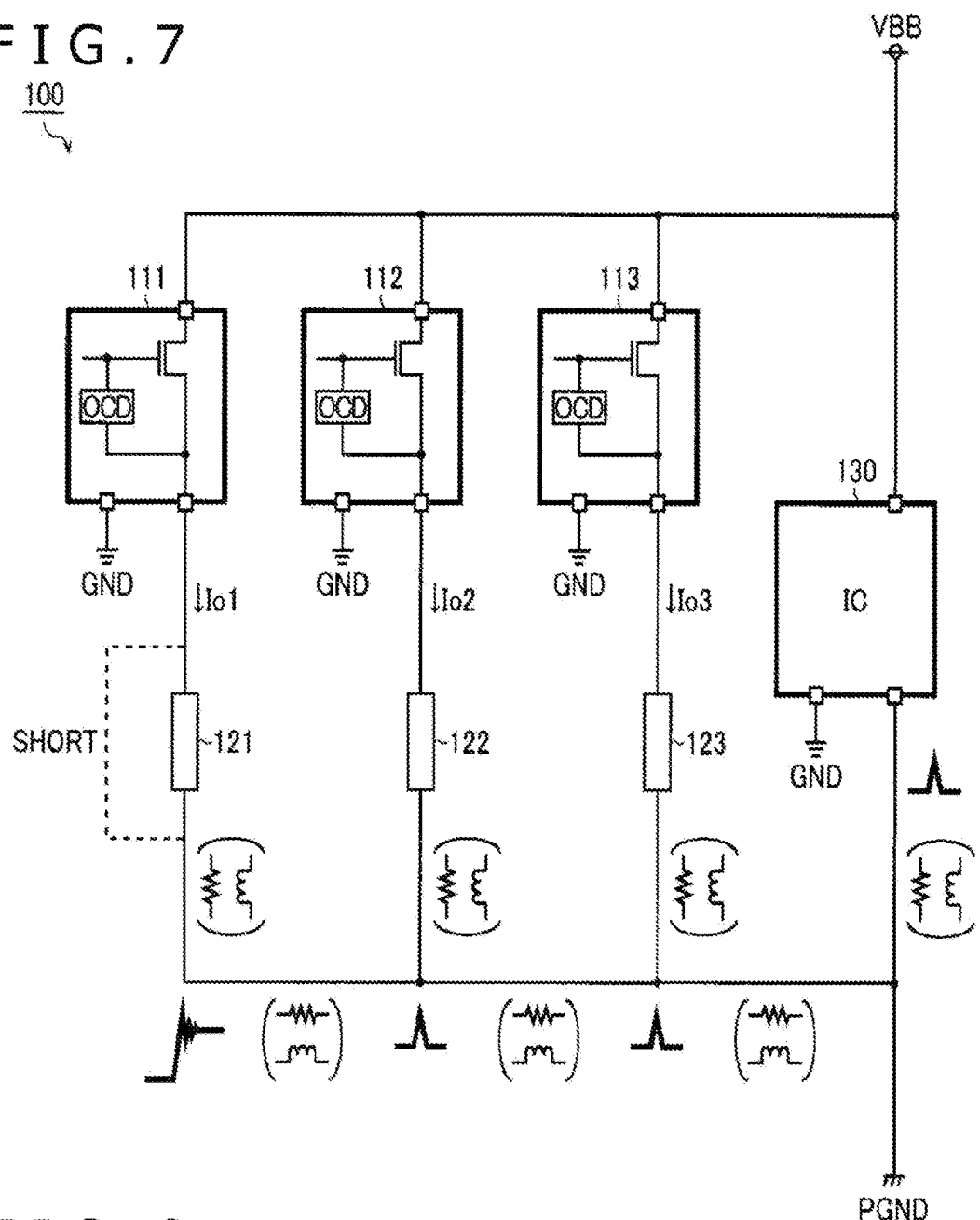
FIG. 7 is a diagram illustrating an example configuration of an electronic device using a plurality of semiconductor integrated circuit devices.

FIG. 7 is a diagram illustrating an example configuration of an electronic device 100 using a plurality of semiconductor integrated circuit devices. The electronic device 100 having this example configuration includes semiconductor integrated circuit devices (in this figure, high-side switch LSIs) 111, 112, and 113, loads 121, 122, and 123, and a semiconductor integrated circuit device (e.g., a power supply IC) 130.

Each of the semiconductor integrated circuit devices 111 to 113 includes an output transistor that establishes and cuts off an electrical connection between a corresponding one of the loads 121 to 123 and a power supply terminal, and an overcurrent protection circuit that limits an output current Io1, Io2, or Io3 that flows through the output transistor to an overcurrent limit value Iocd or lower.

For example, if a short circuit between both ends of the load 121 occurs in the electronic device 100 having this example configuration as illustrated in FIG. 7, the overcurrent protection circuit provided in the semiconductor integrated circuit device 111 operates to limit the output current Io1 to the overcurrent limit value Iocd or lower. However, as described above, when the output current Io1 is limited, an excessive peak current Ipeak may occur (see FIG. 6, presented earlier).

Here, a power-system ground line (i.e., a wire connected to a power-system ground potential PGND) connected in common to the loads 121 to 123 and the semiconductor integrated circuit device 130 involves not a small amount of an impedance component or an inductance component. Therefore, when the above-mentioned peak current Ipeak is large, an unintended change may occur to the power-system ground potential PGND.

Meanwhile, a control-system ground line (i.e., a wire connected to a control-system ground potential GND) connected to each of the semiconductor integrated circuit devices 111 to 113 and 130 is electrically separated from the power-system ground line. Therefore, the control-system ground potential GND is maintained in a relatively stable state regardless of the above-mentioned peak current Ipeak.

Accordingly, when the peak current Ipeak is large, a change occurs only to the power-system ground potential PGND out of the power-system ground potential PGND and the control-system ground potential GND. If this happens, a malfunction (e.g., an erroneous detection of an open output) of each of the semiconductor integrated circuit devices 112 and 113 or a malfunction of the semiconductor integrated circuit device 130 may occur.

In view of the above consideration, a novel overcurrent protection operation that is able to combine securing of an instantaneous current at start-up and a safety design for the time of output limiting (and a novel circuit configuration for implementing this operation) will be proposed below.

<Novel Overcurrent Protection Operation>

Figure 8:
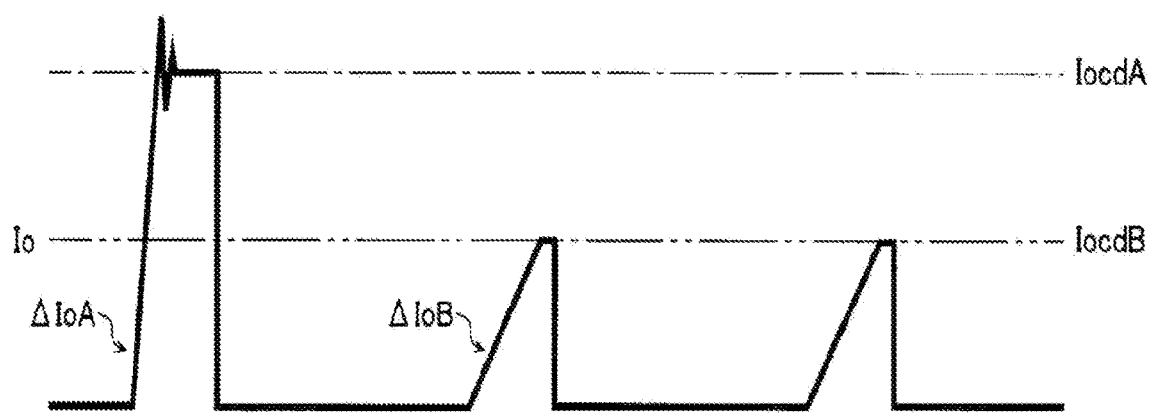
FIG. 8 is a diagram illustrating an example of a novel overcurrent protection operation.

FIG. 8 is a diagram illustrating an example of a novel overcurrent protection operation performed by the overcurrent protection circuit 71. As illustrated in FIG. 8, the overcurrent protection circuit 71 starts performing the hiccup driving on the NMOSFET 10 upon detection of the output current Io reaching a first overcurrent limit value IocdA. This point remains the same as in FIG. 6, presented earlier.

However, in contrast to FIG. 6, presented earlier, the overcurrent protection circuit 71 reduces the overcurrent limit value Iocd for the output current Io from the first overcurrent limit value IocdA to a second overcurrent limit value IocdB smaller than the first overcurrent limit value IocdA, upon detection of the output current Io that flows through the NMOSFET 10 reaching the first overcurrent limit value IocdA.

Note that the first overcurrent limit value IocdA may be set to an appropriate value with, for example, the value of the output current Io (i.e., an inrush current) that should be permitted when the capacitive load is activated taken into consideration. Meanwhile, the second overcurrent limit value IocdB may be set to an appropriate value with the value of the output current Io that flows in normal times taken into consideration.

The overcurrent protection operation as described above makes it possible to set the overcurrent limit value Iocd at the first overcurrent limit value IocdA during a first ON period in the hiccup operation of the NMOSFET 10, and change the overcurrent limit value Iocd to the second overcurrent limit value IocdB during a second and subsequent ON periods, as illustrated in FIG. 8, for example. This will make it possible to increase safety of the set by limiting the divergence between the value of the output current Io in normal times and the overcurrent limit value Iocd (i.e., IocdB) while permitting an inrush current that flows when the capacitive load is activated.

In addition, upon detection of the output current Io reaching the first overcurrent limit value IocdA, the overcurrent protection circuit 71 reduces the rate of rise ΔIo of the output current Io when the NMOSFET 10 transitions to the ON state from a first rate of rise ΔIoA to a second rate of rise ΔIoB, which is lower than the first rate of rise ΔIoA.

The overcurrent protection operation as described above makes it possible to set the rate of rise ΔIo at the first rate of rise ΔIoA during the first ON period in the hiccup operation of the NMOSFET 10, and change the rate of rise ΔIo to the second rate of rise ΔIoB during the second and subsequent ON periods, as illustrated in FIG. 8, for example. This will make it possible to limit the peak current Ipeak (hence a harmful effect on another circuit) in normal times while permitting the inrush current that flows when the capacitive load is activated.

Note that, concerning behavior after the output current Io reaches the first overcurrent limit value IocdA and the NMOSFET 10 is forcibly turned off, the hiccup driving is not necessarily essential, and the above-mentioned current limiting operation (see FIG. 3) may alternatively be performed with the setting of the second overcurrent limit value IocdB and the second rate of rise ΔIoB, for example.

<Semiconductor Integrated Circuit Device (Configuration of Important Sections Thereof)>

Figure 9:
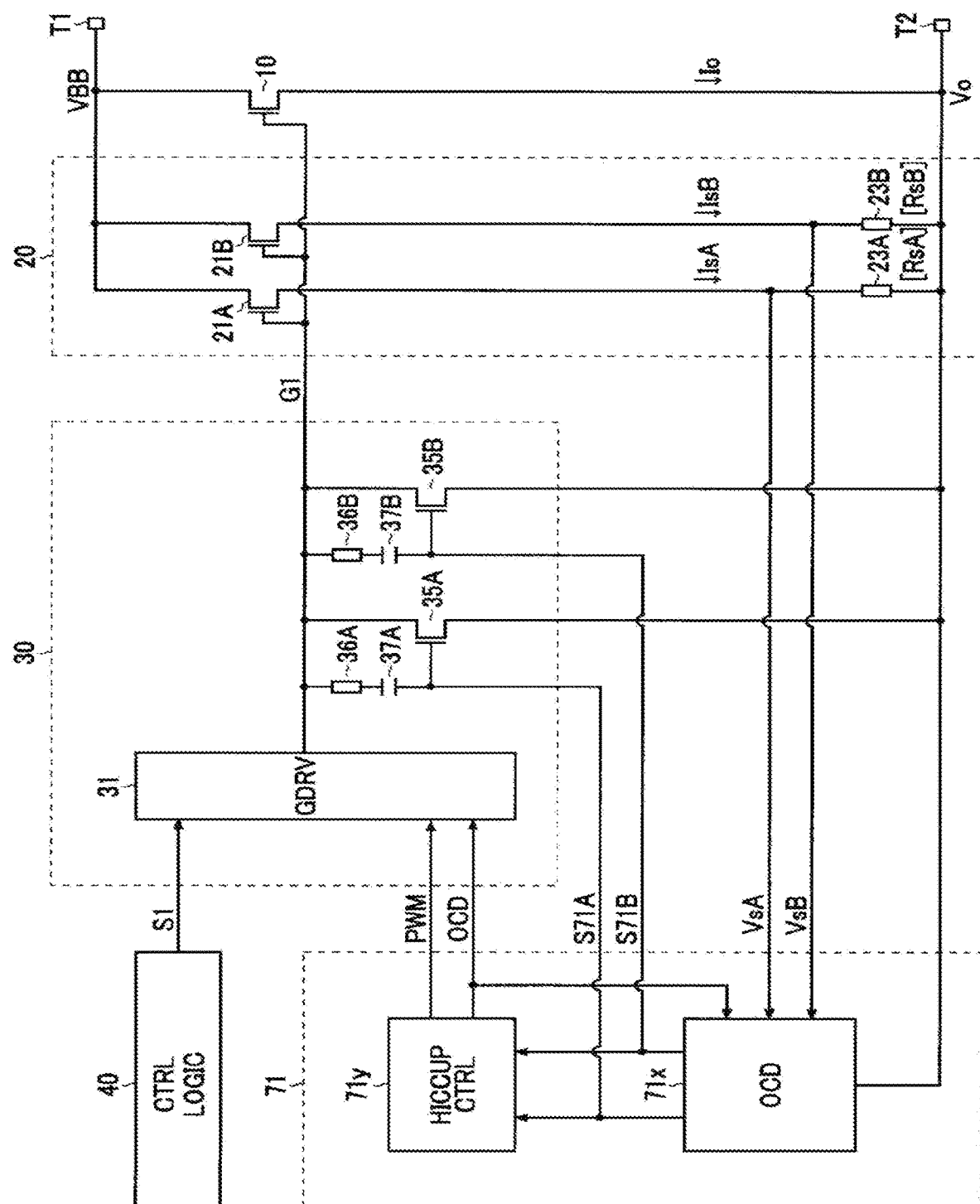
FIG. 9 is a diagram illustrating the configuration of important sections of a semiconductor integrated circuit device.

FIG. 9 is a diagram illustrating the configuration of important sections of the semiconductor integrated circuit device 1 (corresponding to a switch device) (i.e., a novel circuit configuration for implementing the above-described novel overcurrent protection operation).

In the semiconductor integrated circuit device 1 having this example configuration, the output current monitoring section 20 has a configuration basically similar to that in FIG. 1, presented earlier, but includes NMOSFETs 21A and 21B and sense resistors 23A and 23B as components corresponding to the NMOSFET 21 and the sense resistor 23 described above, and generates sense voltages VsA and VsB according to the output current Io.

The NMOSFETs 21A and 21B are each a mirror transistor connected in parallel with the NMOSFET 10 and generate sense currents IsA and IsB, respectively, according to the output current Io. The size ratio between the NMOSFET 10 and the NMOSFETs 21A and 21B is m:1 (m>1). Therefore, each of the sense currents IsA and IsB has a value equal to that of the output current Io multiplied by 1/m. Similarly to the NMOSFET 10, each of the NMOSFETs 21A and 21B is on when the gate drive signal G1 is at the high level, and is off when the gate drive signal G1 is at the low level.

The sense resistor 23A (resistance value: RsA) is connected between a source of the NMOSFET 21A and the external terminal T2, and is a current/voltage conversion element for generating the sense voltage VsA (=IsA×RsA+Vo) according to the sense current IsA.

The sense resistor 23B (resistance value: RsB) is connected between a source of the NMOSFET 21B and the external terminal T2, and is a current/voltage conversion element for generating the sense voltage VsB (=IsB×RsB+Vo) according to the sense current IsB.

In addition, in the semiconductor integrated circuit device 1 having this example configuration, the gate control section 30 has a configuration basically similar to that in FIG. 2, presented earlier, but includes NMOSFETs 35A and 35B, resistors 36A and 36B, and capacitors 37A and 37B as components corresponding to the NMOSFET 35, the resistor 36, and the capacitor 37 described above, and generates the gate drive signal G1 to perform on/off control on the NMOSFET 10.

A drain of each of the NMOSFETs 35A and 35B is connected to the gate of the NMOSFET 10. A source of each of the NMOSFETs 35A and 35B is connected to the external terminal T2. Gates of the NMOSFETs 35A and 35B are connected to application terminals for overcurrent protection signals S71A and S71B, respectively. In addition, the resistor 36A and the capacitor 37A are connected in series between the drain and the gate of the NMOSFET 35A.

Similarly, the resistor 36B and the capacitor 37B are connected in series between the drain and the gate of the NMOSFET 35B.

In the gate control section 30 having this example configuration, if the overcurrent protection signal S71A or S71B makes a transition to a high level, the gate drive signal G1 is caused to decrease in level from the high level (=VG) in a steady state with a predetermined time constant τ (=R36A×C37A or R36B×C37B). As a result, the degree of conduction of the NMOSFET 10 gradually decreases, limiting the output current Io. Meanwhile, if the overcurrent protection signal S71A or S71B makes a transition to a low level, the gate drive signal G1 is caused to increase in level with the predetermined time constant τ. As a result, the degree of conduction of the NMOSFET 10 gradually increases, removing the limitation on the output current Io.

As described above, the gate control section 30 having this example configuration has a function of controlling the gate drive signal G1 so as to limit the output current Io according to the overcurrent protection signal S71A or S71B.

Further, the gate control section 30 (in particular, the gate driver 31) additionally has a function of performing the hiccup driving on the NMOSFET 10 according to an intermittent control signal PWM, and a function of adjusting the rate of rise ΔIo of the output current Io according to an overcurrent detection signal OCD (details thereof will be described below).

In addition, in the semiconductor integrated circuit device 1 having this example configuration, the overcurrent protection circuit 71 includes an overcurrent detection section 71x and a hiccup control section 71y.

The overcurrent detection section 71x monitors the sense voltages VsA and VsB (hence the output current Io) and generates the overcurrent protection signals S71A and S71B. For example, the overcurrent protection signal S71A is at the high level when an overcurrent has been detected (Io>IocdA), and is at the low level when an overcurrent has not been detected (Io<IocdA). Meanwhile, the overcurrent protection signal S71B is at the high level when an overcurrent has been detected (Io>IocdB), and is at the low level when an overcurrent has not been detected (Io<IocdB), for example.

Note that the overcurrent protection signals S71A and S71B are outputted to the gates of the NMOSFETs 35A and 35B, respectively. Accordingly, the gate drive signal G1 is controlled according to the overcurrent protection signal S71A or S71B, so that the output current Io can be limited to the overcurrent limit value Iocd (i.e., IocdA or IocdB) or lower. In addition, the overcurrent protection signals S71A and S71B are outputted to the hiccup control section 71y as well.

The hiccup control section 71y generates the intermittent control signal PWM and the overcurrent detection signal OCD on the basis of the overcurrent protection signals S71A and S71B (corresponding to a result of the detection by the overcurrent detection section 71x) (details thereof will be described below). The intermittent control signal PWM and the overcurrent detection signal OCD are each outputted to the gate control section 30 (in particular, the gate driver 31). In addition, the overcurrent detection signal OCD is outputted to the overcurrent detection section 71x as well.

Figure 10:
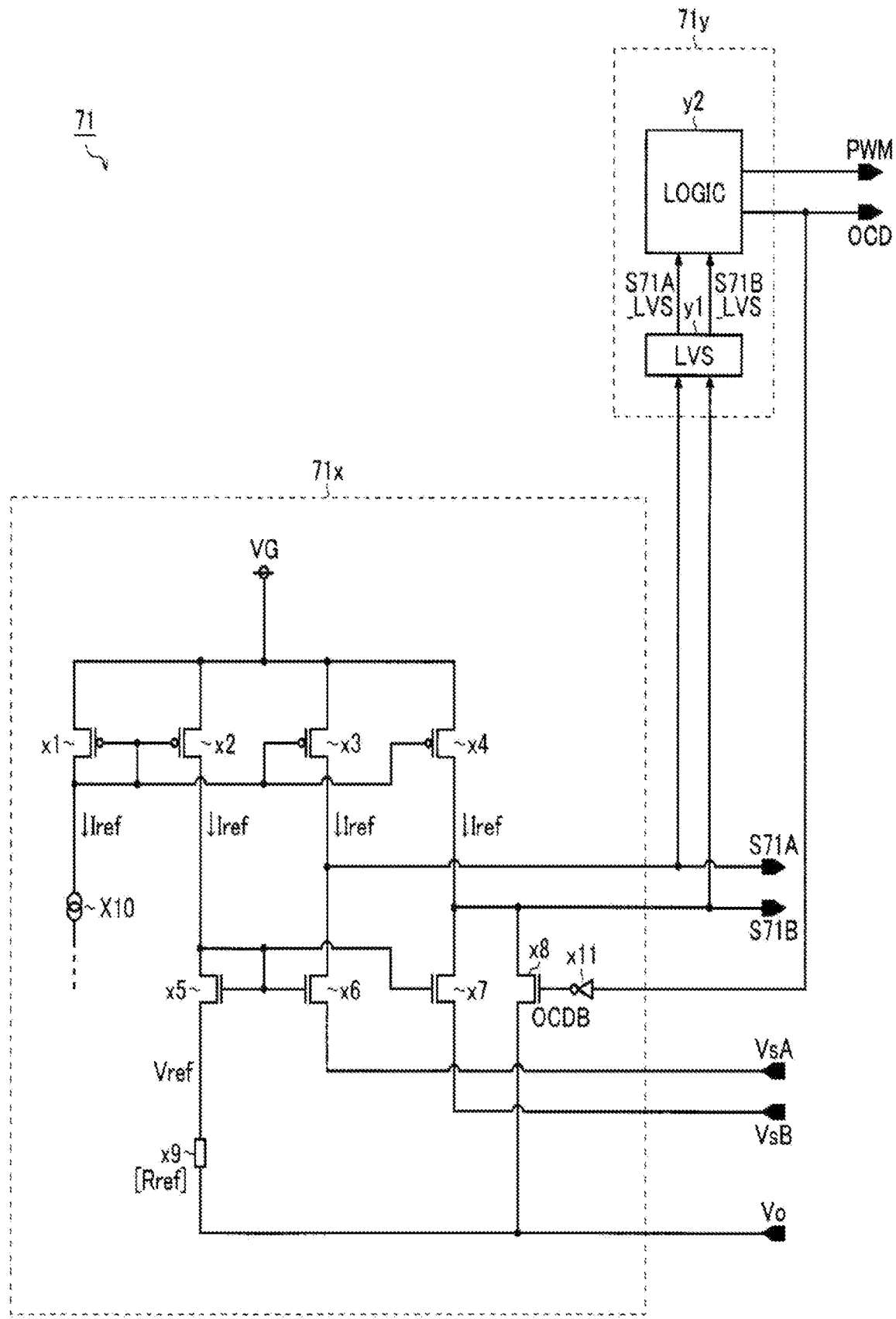
FIG. 10 is a diagram illustrating an example configuration of an overcurrent protection circuit.

FIG. 10 is a diagram illustrating an example configuration of the overcurrent protection circuit 71. In the overcurrent protection circuit 71 having this example configuration, the overcurrent detection section 71x includes P-type metal-oxide-semiconductor field-effect transistors (PMOSFETs) x1, x2, x3, and x4, NMOSFETs x5, x6, x7, and x8, a resistor x9, a current source x10, and an inverter x11.

A source of each of the PMOSFETs x1 to x4 is connected to an application terminal for a stepped-up voltage VG. A gate of each of the PMOSFETs x1 to x4 is connected to a drain of the PMOSFET x1. The drain of the PMOSFET x1 is connected to the current source x10 (i.e., a source of a reference current Iref).

The PMOSFETs x1 to x4 thus connected form a current mirror that mirrors the reference current Iref inputted to the drain of the PMOSFET x1 and outputs the reference current Iref from a drain of each of the PMOSFETs x2 to x4.

The drain of the PMOSFET x2 is connected to a drain of the NMOSFET x5. The drain of the PMOSFET x3 is connected to a drain of the NMOSFET x6 and an output terminal for the overcurrent protection signal S71A. The drain of the PMOSFET x4 is connected to a drain of each of the NMOSFETs x7 and x8 and an output terminal for the overcurrent protection signal S71B. A gate of each of the NMOSFETs x5 to x7 is connected to the drain of the NMOSFET x5.

A source of the NMOSFET x5 is connected to a first end of the resistor x9 (resistance value: Rref). A second end of the resistor x9 and a source of the NMOSFET x8 are each connected to the application terminal (i.e., the external terminal T2) for the output voltage Vo. A source of the NMOSFET x6 is connected to an application terminal for the sense voltage VsA. A source of the NMOSFET x7 is connected to an application terminal for the sense voltage VsB.

A gate of the NMOSFET x8 is connected to an output terminal (i.e., an application terminal for an inverse overcurrent detection signal OCDB) of the inverter x11. An input terminal of the inverter x11 is connected to an application terminal for the overcurrent detection signal OCD. The inverter x11 inverts the logic level of the overcurrent detection signal OCD and generates the inverse overcurrent detection signal OCDB.

In the overcurrent detection section 71x having the above-described configuration, a reference voltage Vref (=Iref× Rref+Vo) is applied to the source of the NMOSFET x5. Meanwhile, the sense voltage VsA (=IsA×RsA+Vo) according to the sense current IsA (hence the output current Io) is applied to the source of the NMOSFET x6. In addition, the sense voltage VsB (=IsB×RsB+Vo) according to the sense current IsB (hence the output current Io) is applied to the source of the NMOSFET x7.

Accordingly, the overcurrent protection signal S71A drawn from the drain of the NMOSFET x6 is at the low level (i.e., a logic level for a time when the output current Io is not limited) when the sense voltage VsA is lower than the reference voltage Vref, and is at the high level (i.e., a logic level for a time when the output current Io is limited) when the sense voltage VsA is higher than the reference voltage Vref.

Similarly, the overcurrent protection signal S71B drawn from the drain of the NMOSFET x7 is at the low level (i.e., a logic level for the time when the output current Io is not limited) when the sense voltage VsB is lower than the reference voltage Vref, and is at the high level (i.e., a logic level for the time when the output current Io is limited) when the sense voltage VsB is higher than the reference voltage Vref.

Figure 11:
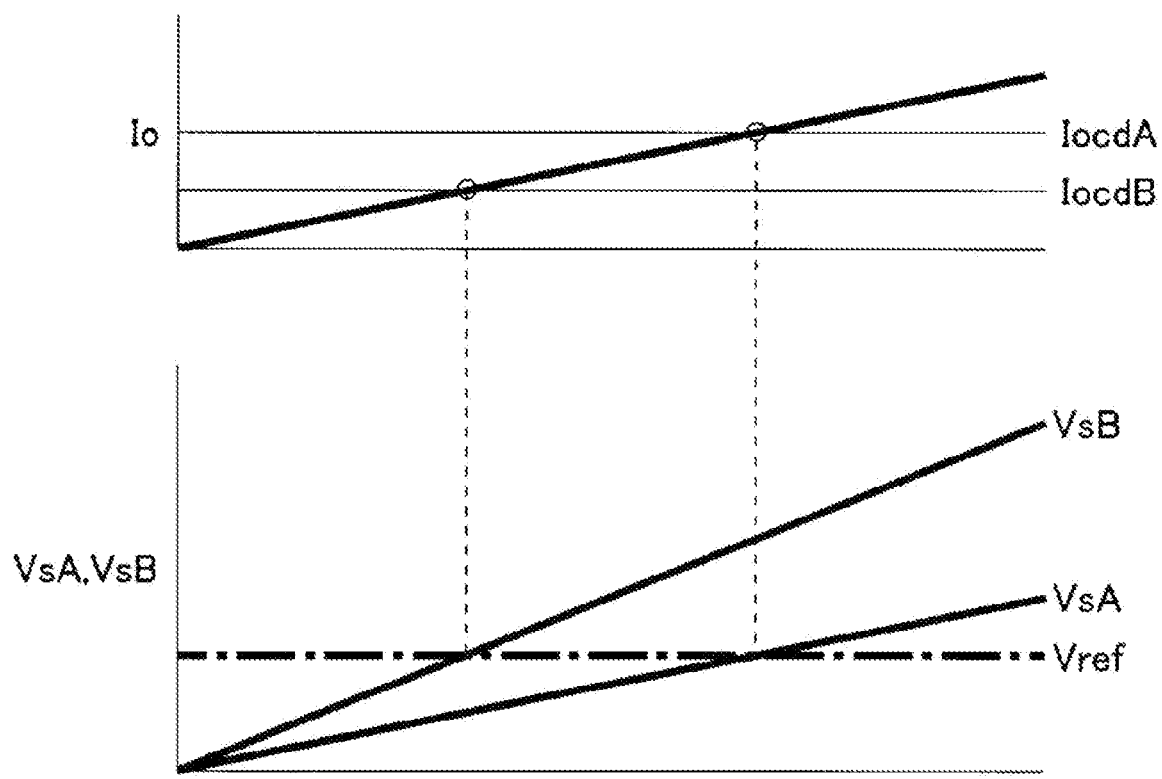
FIG. 11 is a diagram illustrating an example of setting of overcurrent limit values.

FIG. 11 is a diagram illustrating an example of setting of the first overcurrent limit value IocdA and the second overcurrent limit value IocdB.

In this figure, the rate of change (=ΔVsA/ΔIo) of the sense voltage VsA with respect to the output current Io is set to be smaller than the rate of change (=ΔVsB/ΔIo) of the sense voltage VsB with respect to the output current Io (for example, RsA<RsB). In this case, the value of the output current Io when VsA=Vref corresponds to the first overcurrent limit value IocdA, and the value of the output current Io when VsB=Vref corresponds to the second overcurrent limit value IocdB (<IocdA).

Comparing the sense voltages VsA and VsB with the reference voltage Vref in such a manner means comparing the output current Io with the overcurrent limit value Iocd (i.e., IocdA and IocdB).

That is, the overcurrent detection section 71x generates the overcurrent protection signals S71A and S71B according to a result of comparing the output current Io with the overcurrent limit value Iocd (i.e., IocdA and IocdB), thereby controlling the gate drive signal G1 for the NMOSFET 10 such that the output current Io will be limited to the overcurrent limit value Iocd (i.e., IocdA and IocdB) or lower.

Returning to FIG. 10, the description of the circuit configuration of the overcurrent protection circuit 71 is resumed. In the overcurrent protection circuit 71 having this example configuration, the hiccup control section 71y includes a level shifter y1 and a logic section y2.

The level shifter y1 shifts the signal level (VG−Vo) of each of the overcurrent protection signals S71A and S71B, thereby generating overcurrent protection signals S71A_LVS and S71B_LVS each having a signal level (VBB−GND) that is compatible with an input dynamic range of the logic section y2.

On the basis of the level-shifted overcurrent protection signals S71A_LVS and S71B_LVS inputted from the level shifter y1, the logic section y2 generates the intermittent control signal PWM and the overcurrent detection signal OCD.

The intermittent control signal PWM is a pulse signal that is generated to perform the hiccup driving on the NMOSFET 10 in response to a transition of the overcurrent protection signal S71A to the high level. Specifically, the intermittent control signal PWM is subjected to pulse driving such that a predetermined high-level period (corresponding to the ON period ton of the NMOSFET 10) and a predetermined low-level period (corresponding to the OFF period toff of the NMOSFET 10) are repeated during the hiccup driving of the NMOSFET 10.

The overcurrent detection signal OCD is latched from a low level to a high level when the overcurrent protection signal S71A has made a transition to the high level. That is, the overcurrent detection signal OCD makes a transition from the low level to the high level when the output current Io has exceeded the first overcurrent limit value IocdA, and is thereafter maintained at the high level even if the output current Io falls below the first overcurrent limit value IocdA.

Here, when the overcurrent detection signal OCD is at the low level (i.e., when the inverse overcurrent detection signal OCDB is at a high level), the NMOSFET x8 is on, and the overcurrent protection signal S71B is accordingly fixed at the low level (=Vo). In other words, of the overcurrent protection signals S71A and S71B, the overcurrent protection signal S71B is made ineffective. This state corresponds to a state in which the overcurrent limit value Iocd is set at the first overcurrent limit value IocdA.

Meanwhile, when the overcurrent detection signal OCD is at the high level (i.e., when the inverse overcurrent detection signal OCDB is at a low level), the NMOSFET x8 is off, and the fixing of the overcurrent protection signal S71B at the low level is released. This state corresponds to a state in which the overcurrent limit value Iocd is set at the second overcurrent limit value IocdB (<IocdA). This is because, when the output current Io increases, the output current Io necessarily reaches the second overcurrent limit value IocdB (i.e., the overcurrent protection signal S71B makes a transition to the high level) before reaching the first overcurrent limit value IocdA (i.e., before the overcurrent protection signal S71A makes a transition to the high level).

Figure 12:
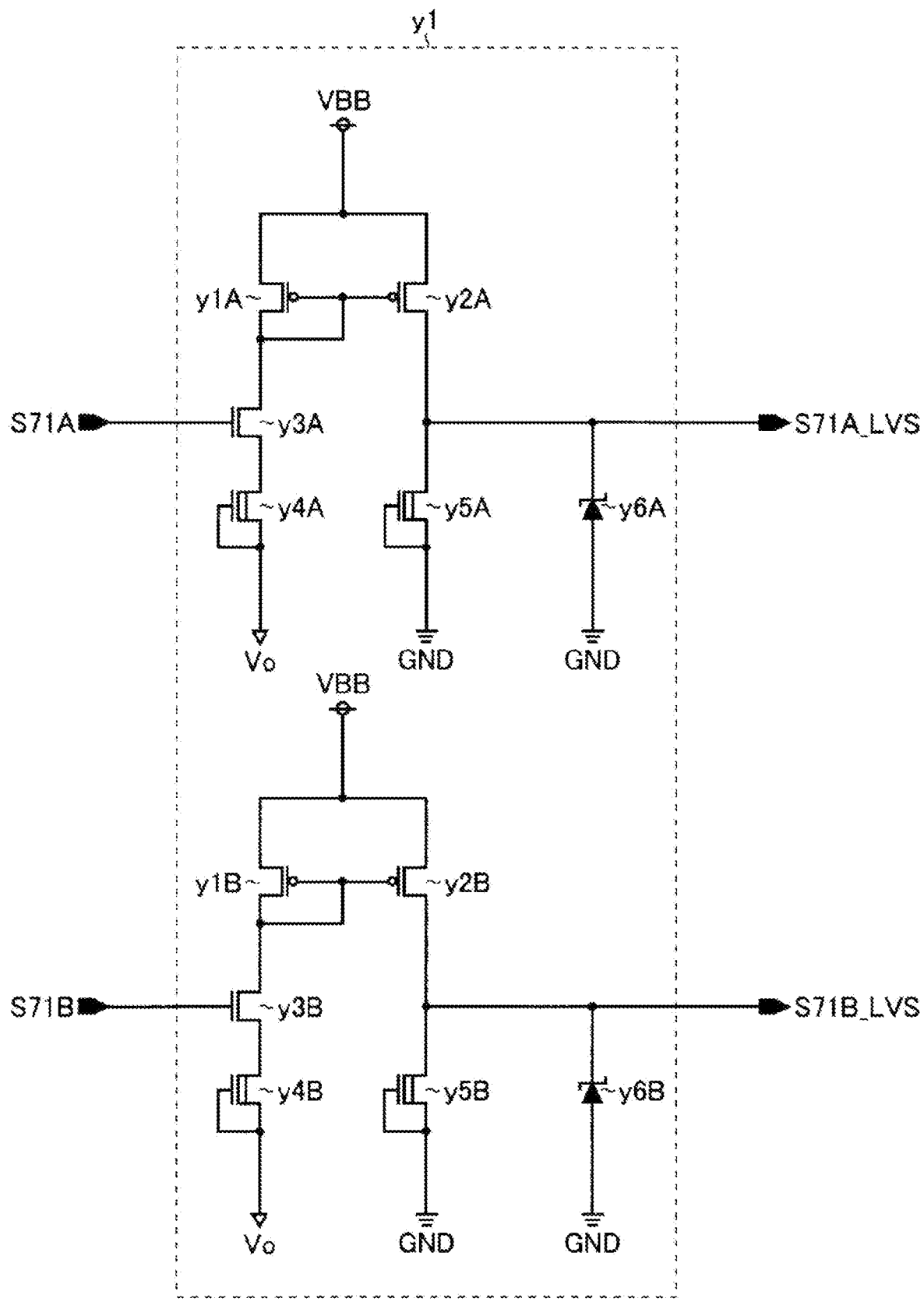
FIG. 12 is a diagram illustrating an example configuration of a level shifter.

FIG. 12 is a diagram illustrating an example configuration of the level shifter y1. The level shifter y1 having this example configuration includes PMOSFETs y1A and y1B, PMOSFETs y2A and y2B, NMOSFETs y3A and y3B, NMOSFETs y4A and y4B (depletion type), NMOSFETs y5A and y5B (depletion type), and Zener diodes y6A and y6B.

A source of each of the PMOSFETs y1A and y2A is connected to an application terminal for the power supply voltage VBB. A gate of each of the PMOSFETs y1A and y2A is connected to a drain of the PMOSFET y1A. The drain of the PMOSFET y1A is connected to a drain of the NMOSFET y3A. A gate of the NMOSFET y3A is connected to an input terminal for the overcurrent protection signal S71A. A source of the NMOSFET y3A is connected to a drain of the NMOSFET y4A. A source and a gate of the NMOSFET y4A are each connected to an application terminal for the output voltage Vo (i.e., the external terminal T2). A drain of the PMOSFET y2A, a drain of the NMOSFET y5A and a cathode of the Zener diode y6A are each connected to an output terminal for the level-shifted overcurrent protection signal S71A_LVS. A source and a back gate of the NMOSFET y5A and an anode of the Zener diode y6A are each connected to a ground terminal GND.

A source of each of the PMOSFETs y1B and y2B is connected to an application terminal for the power supply voltage VBB. A gate of each of the PMOSFETs y1B and y2B is connected to a drain of the PMOSFET y1B. The drain of the PMOSFET y1B is connected to a drain of the NMOSFET y3B. A gate of the NMOSFET y3B is connected to an input terminal for the overcurrent protection signal S71B. A source of the NMOSFET y3B is connected to a drain of the NMOSFET y4B. A source and a gate of the NMOSFET y4B are each connected to an application terminal for the output voltage Vo (i.e., the external terminal T2). A drain of the PMOSFET y2B, a drain of the NMOSFET y5B and a cathode of the Zener diode y6B are each connected to an output terminal for the level-shifted overcurrent protection signal S71B_LVS. A source and a back gate of the NMOSFET y5B and an anode of the Zener diode y6B are each connected to a ground terminal GND.

The level shifter y1 having this example configuration is able to generate the overcurrent protection signals S71A_LVS and S71B_LVS each having a signal level (VBB−GND) that is compatible with the input dynamic range of the logic section y2 by shifting the signal level (VG−Vo) of each of the overcurrent protection signals S71A and S71B.

Figure 13:
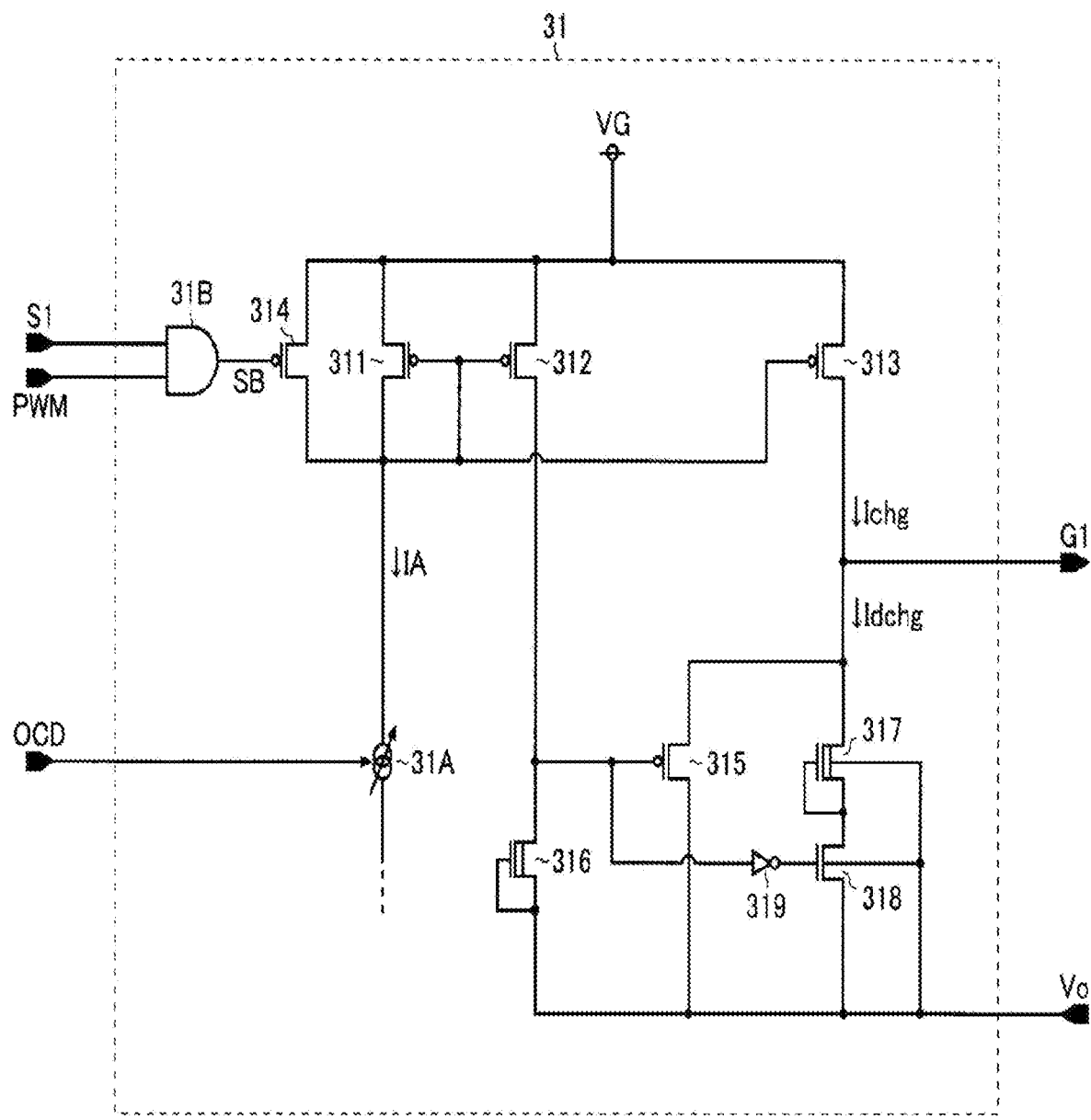
FIG. 13 is a diagram illustrating an example configuration of a gate driver.

FIG. 13 is a diagram illustrating an example configuration of the gate driver 31. The gate driver 31 having this example configuration includes PMOSFETs 311, 312, 313, 314, and 315, NMOSFETs 316 and 317 (depletion type), an NMOSFET 318, an inverter 319, a variable current source 31A, and an AND gate 31B.

A source of each of the PMOSFETs 311 to 313 is connected to an application terminal for the stepped-up voltage VG. A gate of each of the PMOSFETs 311 to 313 is connected to a drain of the PMOSFET 311. The drain of the PMOSFET 311 is connected to the variable current source 31A (i.e., a source of a variable current IA, the current value of which is variable according to the overcurrent detection signal OCD).

The PMOSFETs 311 to 313 thus connected form a current mirror that mirrors the variable current IA inputted to the drain of the PMOSFET 311 and outputs a mirror current from a drain of each of the PMOSFETs 312 and 313.

In particular, the mirror current that flows through the drain of the PMOSFET 313 corresponds to a charging current Ichg (i.e., a current for charging of gate capacitance of the NMOSFET 10) for causing the gate drive signal G1 to make a transition to the high level when the NMOSFET 10 transitions to the ON state. Accordingly, the charging current Ichg has a current value dependent on the variable current IA.

The drain of the PMOSFET 312 is connected to a gate of the PMOSFET 315, a drain of the NMOSFET 316, and an input terminal of the inverter 319. The drain of the PMOSFET 313 is connected to a source of the PMOSFET 315, a drain of the NMOSFET 317, and an output terminal for the gate drive signal G1. A source and a gate of the NMOSFET 317 are each connected to a drain of the NMOSFET 318. A gate of the NMOSFET 318 is connected to an output terminal of the inverter 319. A drain of the PMOSFET 315, a source and a gate of the NMOSFET 316, a back gate of the NMOSFET 317, and a source and a back gate of the NMOSFET 318 are each connected to an application terminal for the output voltage Vo (i.e., the external terminal T2).

The PMOSFET 315, the NMOSFETs 316 to 318, and the inverter 319 thus connected function as a discharging current generation section that generates a discharging current Idchg (i.e., a current for discharging of the gate capacitance of the NMOSFET 10) for causing the gate drive signal G1 to make a transition to the low level when the NMOSFET 10 transitions to the OFF state. Note that, in contrast to the charging current Ichg, the discharging current Idchg is not dependent on the variable current IA.

The AND gate 31B generates a logical conjunction signal SB representing a logical conjunction of the gate control signal S1 and the intermittent control signal PWM and outputs the generated logical conjunction signal SB to a gate of the PMOSFET 314. The logical conjunction signal SB is at a low level when at least one of the gate control signal S1 and the intermittent control signal PWM is at a low level, and is at a high level when the gate control signal S1 and the intermittent control signal PWM are both at a high level.

A source of the PMOSFET 314 is connected to the application terminal for the stepped-up voltage VG. A drain of the PMOSFET 314 is connected to the drain of the PMOSFET 311. The gate of the PMOSFET 314 is connected to an output terminal (i.e., an application terminal for the logical conjunction signal SB) of the AND gate 31B.

The PMOSFET 314 described above is off when the logical conjunction signal SB is at the high level. When the PMOSFET 314 is off, the current mirror formed by the PMOSFETs 311 to 313 is effective. Accordingly, the charging current Ichg (∝ IA) flows out of the drain of the PMOSFET 313 toward the output terminal for the gate drive signal G1. In addition, when the above-mentioned current mirror is effective, the mirror current flows through the drain of the PMOSFET 312, causing a gate potential of the PMOSFET 315 to be at a high level, and further causing a gate potential of the NMOSFET 318 to be at a low level. As a result, the PMOSFET 315 and the NMOSFET 318 are each turned off, stopping the discharging current Idchg from flowing.

Meanwhile, the PMOSFET 314 is on when the logical conjunction signal SB is at the low level. When the PMOSFET 314 is on, the current mirror formed by the PMOSFETs 311 to 313 is ineffective, stopping output of the charging current Ichg (∝ IA). In addition, when the above-mentioned current mirror is ineffective, the mirror current stops flowing through the drain of the PMOSFET 312, causing the gate potential of the PMOSFET 315 to be at a low level, and further causing the gate potential of the NMOSFET 318 to be at a high level. As a result, the PMOSFET 315 and the NMOSFET 318 are each turned on, causing the discharging current Idchg to be drawn from the output terminal for the gate drive signal G1 toward the PMOSFET 315 and the NMOSFET 317.

Figure 14:
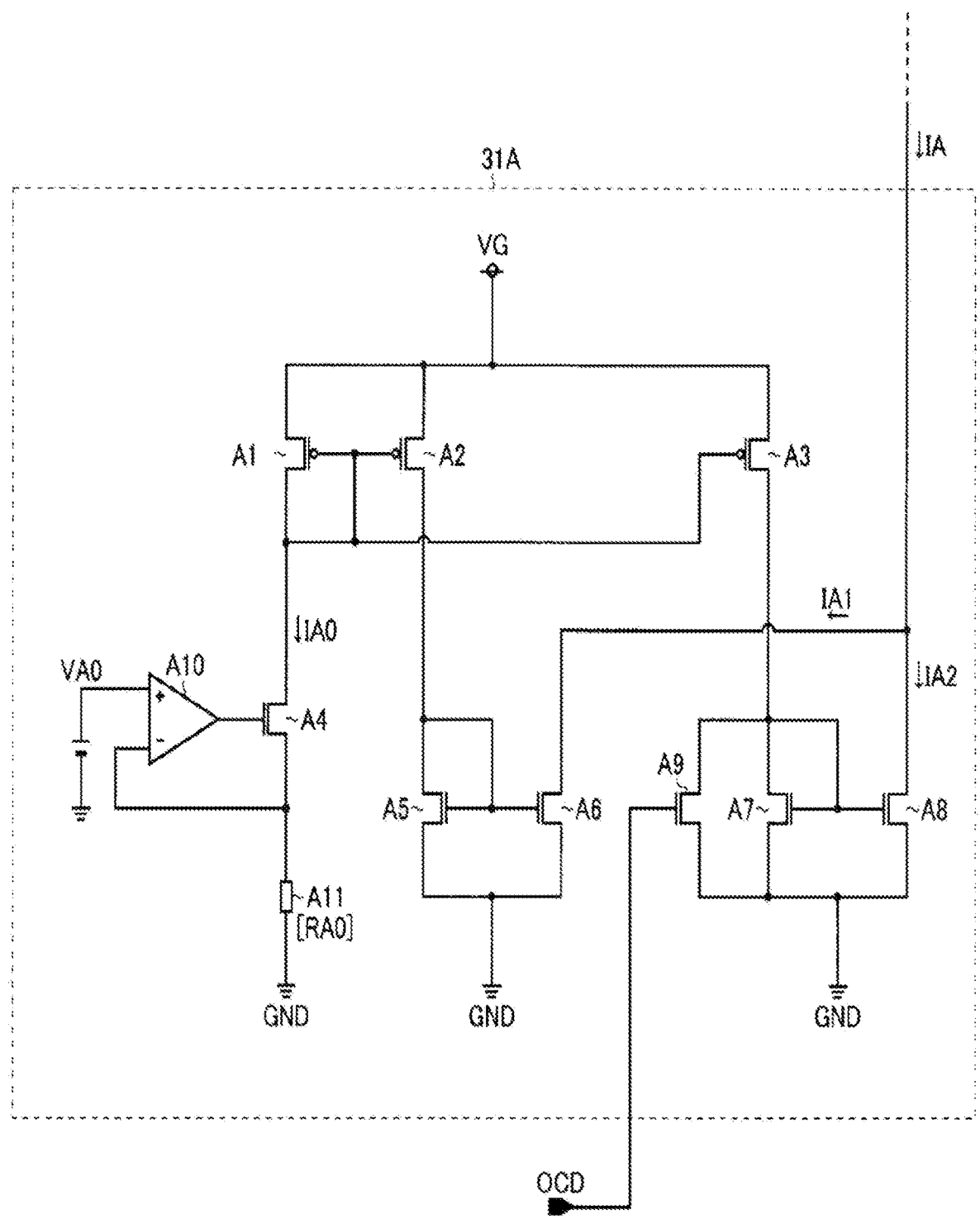
FIG. 14 is a diagram illustrating an example configuration of a variable current source.

FIG. 14 is a diagram illustrating an example configuration of the variable current source 31A. The variable current source 31A having this example configuration includes PMOSFETs A1, A2, and A3, NMOSFETs A4, A5, A6, A7, A8, and A9, an operational amplifier A10, and a resistor A11.

A source of each of the PMOSFETs A1 to A3 is connected to an application terminal for the stepped-up voltage VG. A gate of each of the PMOSFETs A1 to A3 is connected to a drain of the PMOSFET A1. The drain of the PMOSFET A1 is connected to a drain of the NMOSFET A4 (i.e., an output terminal for a reference current IA0).

The PMOSFETs A1 to A3 thus connected form a current mirror that mirrors the reference current IA0 inputted to the drain of the PMOSFET A1 and outputs a mirror current from a drain of each of the PMOSFETs A2 and A3.

An output terminal of the operational amplifier A10 is connected to a gate of the NMOSFET A4. A non-inverting input terminal (+) of the operational amplifier A10 is connected to an application terminal for a reference voltage VA0. An inverting input terminal (−) of the operational amplifier A10 is connected to a source of the NMOSFET A4. The resistor A11 (resistance value: RA0) is connected between the source of the NMOSFET A4 and a ground terminal GND.

The operational amplifier A10 thus connected performs gate control on the NMOSFET A4 such that an imaginary short between the non-inverting input terminal (+) and the inverting input terminal (−) occurs. As a result, the reference current IA0 (=VA0/RA0) according to the reference voltage VA0 and the resistance value RA0 flows through the resistor A11. Specifically, the reference current IA0 increases as the resistance value RA0 increases, and decreases as the resistance value RA0 decreases. Accordingly, it is possible to adjust the reference current IA0 as desired by using an external discrete element as the resistor A11. In addition, it is possible to increase precision in setting the reference current IA0 by using a cascode circuit for a differential stage in the operational amplifier A10.

The drain of the PMOSFET A2 is connected to a drain of the NMOSFET A5. A gate of each of the NMOSFETs A5 and A6 is connected to the drain of the NMOSFET A5. A source of each of the NMOSFETs A5 and A6 is connected to a ground terminal GND. A drain of the NMOSFET A6 is connected to an output terminal for the variable current IA.

The NMOSFETs A5 and A6 thus connected form a current mirror that further mirrors the mirror current (i.e., the reference current IA0) that flows through the drain of the PMOSFET A2 and generates a first current IA1 that flows through the drain of the NMOSFET A6.

The drain of the PMOSFET A3 is connected to a drain of the NMOSFET A7. A gate of each of the NMOSFETs A7 and A8 is connected to the drain of the NMOSFET A7. A source of each of the NMOSFETs A7 and A8 is connected to a ground terminal GND. A drain of the NMOSFET A8 is connected to the output terminal for the variable current IA.

The NMOSFETs A7 and A8 thus connected form a current mirror that further mirrors the mirror current (i.e., the reference current IA0) that flows through the drain of the PMOSFET A3 and generates a second current IA2 that flows through the drain of the NMOSFET A8.

A drain of the NMOSFET A9 is connected to the drain of the NMOSFET A7. A source of the NMOSFET A9 is connected to the ground terminal GND. A gate of the NMOSFET A9 is connected to an application terminal for the overcurrent detection signal OCD.

The NMOSFET A9 described above is off when the overcurrent detection signal OCD is at the low level. When the NMOSFET A9 is off, the current mirror formed by the NMOSFETs A7 and A8 is effective, causing the second current IA2 to flow through the drain of the NMOSFET A8. This results in a state in which a sum (=IA1+IA2) of the first current IA1 and the second current IA2 flows as the variable current IA.

This state corresponds to a state in which the charging current Ichg described above (see FIG. 13) has been increased, i.e., a state in which the rate of rise ΔIo of the output current Io has been set at the first rate of rise ΔIoA (see FIG. 8).

Meanwhile, the NMOSFET A9 is on when the overcurrent detection signal OCD is at the high level. When the NMOSFET A9 is on, the current mirror formed by the NMOSFETs A7 and A8 is ineffective, stopping the second current IA2 from flowing through the drain of the NMOSFET A8. This results in a state in which the first current IA1 alone flows as the variable current IA.

This state corresponds to a state in which the charging current Ichg described above (see FIG. 13) has been reduced, i.e., a state in which the rate of rise ΔIo of the output current Io has been reduced to the second rate of rise ΔIoB, which is lower than the first rate of rise ΔIoA (see FIG. 8).

Figure 15:
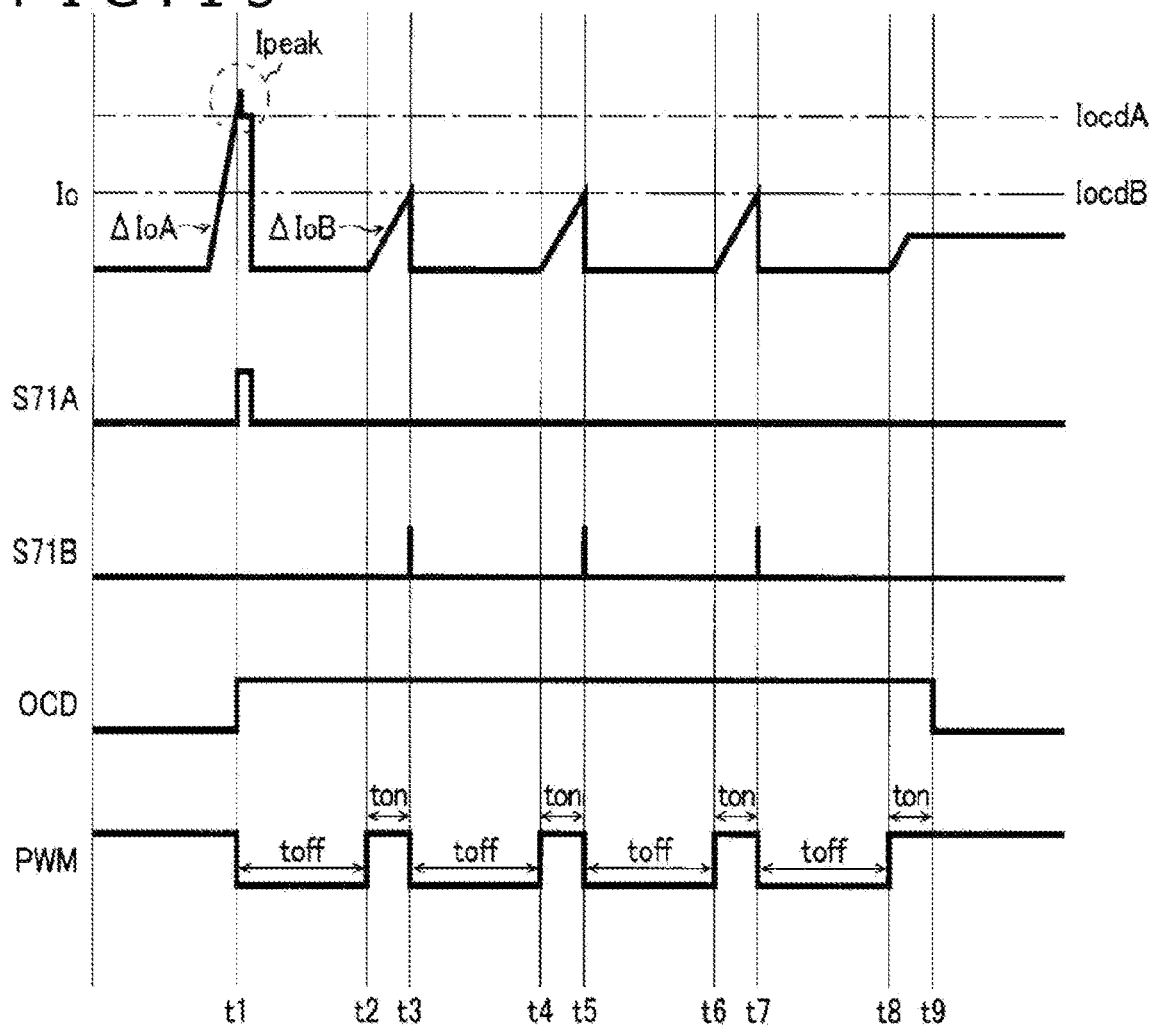
FIG. 15 is a diagram illustrating an example of an overcurrent protection operation according to the above example configurations.

FIG. 15 is a diagram illustrating an example of the overcurrent protection operation according to the above example configurations, and represents, from top to bottom, the output current Io, the overcurrent protection signals S71A and S71B, the overcurrent detection signal OCD, and the intermittent control signal PWM.

Prior to time t1, the overcurrent detection signal OCD is maintained at the low level because no overcurrent has ever been detected. Accordingly, as described above, the overcurrent limit value Iocd for the output current Io is set at the first overcurrent limit value IocdA (>IocdB), and the rate of rise ΔIo of the output current Io is set at the first rate of rise ΔIoA (>ΔIoB).

If the output current Io reaches the first overcurrent limit value IocdA at time t1, a current limiting operation is started by the overcurrent protection signal S71A. Accordingly, the output current Io is basically limited to the first overcurrent limit value IocdA or lower. Note that a transient peak current Ipeak may occur at a first detection of an overcurrent.

In addition, at time t1, the overcurrent detection signal OCD is latched to the high level with a transition of the overcurrent protection signal S71A to the high level as a trigger. As a result, the overcurrent limit value Iocd for the output current Io is reduced from the first overcurrent limit value IocdA to the smaller, second overcurrent limit value IocdB, and the rate of rise ΔIo of the output current Io is reduced from the first rate of rise ΔIoA to the lower second rate of rise ΔIoB.

Moreover, at time t1, the intermittent control signal PWM makes a transition to the low level, so that the NMOSFET 10 is forcibly turned off, and subsequent hiccup driving is started.

If the predetermined OFF period toff has passed at time t2, the intermittent control signal PWM makes a transition to the high level, so that the forcible OFF state of the NMOSFET 10 is terminated. As a result, the output current Io gently increases at the second rate of rise ΔIoB. If the output current Io thereafter reaches the second overcurrent limit value IocdB, a current limiting operation is started by the overcurrent protection signal S71B. Accordingly, the output current Io is basically limited to the second overcurrent limit value IocdB or lower.

If the predetermined ON period ton has passed at time t3, the intermittent control signal PWM makes a transition to the low level, so that the NMOSFET 10 is forcibly turned off again. Thereafter, as long as the output current Io continues to be in an overcurrent state, the hiccup driving of the NMOSFET 10 is continued (see times t3 to t8).

As illustrated at times t8 to t9, if the predetermined ON period ton has passed without the output current Io reaching the second overcurrent limit value IocdB since the forcible OFF state of the NMOSFET 10 is terminated, the overcurrent detection signal OCD makes a transition to the low level again. As a result, as in a period prior to time t1, the overcurrent limit value Iocd for the output current Io is set at the first overcurrent limit value IocdA (>IocdB), and the rate of rise ΔIo of the output current Io is set at the first rate of rise ΔIoA (>ΔIoB).

The above series of overcurrent protection operations makes it possible to combine securing of an instantaneous current at start-up and a safety design for the time of output limiting. In addition, the peak current during the output limiting can be limited to prevent or reduce a harmful effect on the set.

<Application to Vehicle>

Figure 16:
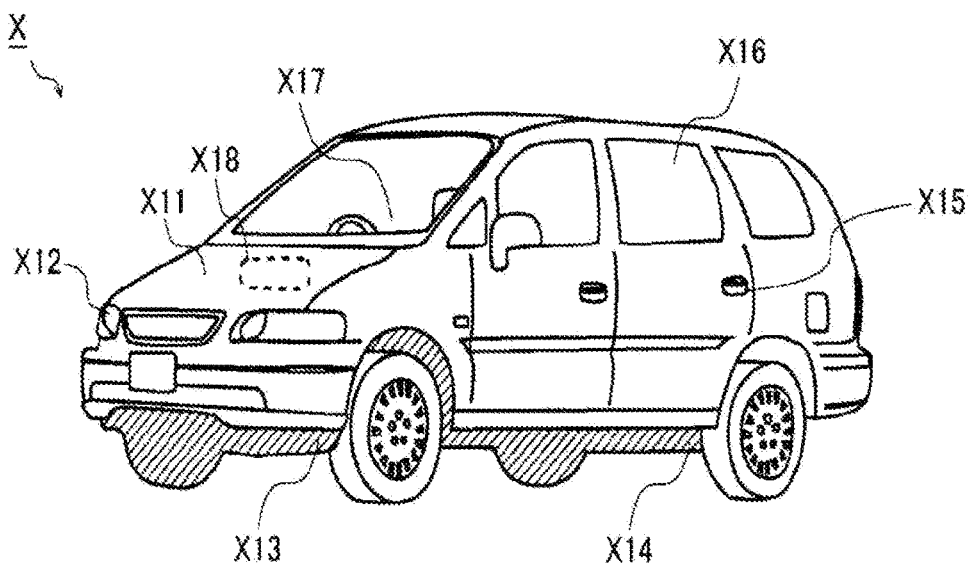
FIG. 16 is a diagram illustrating an external appearance of a vehicle.

FIG. 16 is an external view illustrating an example configuration of a vehicle X. The vehicle X having this example configuration has installed therein a battery (not depicted in this figure), and various types of electronic devices X11, X12, X13, X14, X15, X16, X17, and X18 that operate, receiving supply of power from the battery. For illustration reasons, the positions at which the electronic devices X11 to X18 are installed in this figure may be different from actual positions at which the electronic devices X11 to X18 are installed.

The electronic device X11 is an engine control unit that performs control (e.g., injection control, electronic throttle control, idling control, oxygen sensor heater control, autocruise control, etc.) related to an engine.

The electronic device X12 is a lamp control unit that performs lighting on/off control on a high-intensity discharge lamp (HID), a daytime running lamp (DRL), or other lamps.

The electronic device X13 is a transmission control unit that performs control related to a transmission.

The electronic device X14 is a body control unit that performs control (e.g., anti-lock brake system (ABS) control, electric power steering (EPS) control, electronic suspension control, etc.) related to motion of the vehicle X.

The electronic device X15 is a security control unit that performs drive control on a door lock, a security alarm, or the like.

The electronic device X16 is an electronic device incorporated in the vehicle X as a standard accessory or a manufacturer option in a stage of shipment from a factory. Examples of the electronic device X16 include windshield wipers, electric door mirrors, power windows, dampers (shock absorbers), an electric sunroof, and electric vehicle seats.

The electronic device X17 is an electronic device optionally attached to the vehicle X as a user option. Examples of the electronic device X17 include an onboard audio/visual (A/V) system, a car navigation system, and an electronic toll collection system (ETC).

The electronic device X18 is an electronic device provided with a high-voltage motor. Examples of the electronic device X18 include an onboard blower, an oil pump, a water pump, and a battery cooling fan.

Note that the semiconductor integrated circuit device 1, the ECU 2, and the load 3 described above can each be incorporated in any of the electronic devices X11 to X18.

OTHER MODIFICATIONS

Although the in-vehicle high-side switch LSI has been described as an example in the above description of the embodiment, the overcurrent protection circuit as disclosed herein is applicable not only to the in-vehicle high-side switch LSI but also, for example, to other types of in-vehicle IPDs (e.g., an in-vehicle low-side switch LSI, a power supply LSI, etc.), needless to say, and also widely to semiconductor integrated circuit devices (e.g., a general-purpose power supply control circuit) for use in applications other than vehicles.

Note that the various technical features disclosed herein may be modified in a variety of manners without departing from the gist of the above-described embodiment or technical ingenuity thereof. That is, the above-described embodiment should be considered to be in all aspects illustrative and not restrictive, and the technical scope of the present disclosure should be understood to be defined not by the above description of the embodiment but by the appended claims, and to encompass all modifications that fall within the scope and spirit of the appended claims and equivalents thereof.

The technology disclosed herein are applicable to, for example, in-vehicle IPDs.

What is claimed is:

1. An overcurrent protection circuit, comprising:
   an overcurrent detection section configured to detect whether an output current that flows through a switch element is reaching a first overcurrent limit value; and
   a hiccup control section configured to start a hiccup driving operation on the switch element based on a result of the detection by the overcurrent detection section, wherein
      the hiccup driving operation includes control of a drive signal for the switch element such that a predetermined ON period and a predetermined OFF period of the switch element are periodically repeated to reduce an overcurrent limit value for the output current from the first overcurrent limit value to a second overcurrent limit value which is smaller than the first overcurrent limit value.

2. The overcurrent protection circuit according to claim 1, wherein the overcurrent detection section is further configured to reduce a rate of rise of the output current from a first rate of rise to a second rate of rise which is lower than the first rate of rise, based on the detection of the output current reaching the first overcurrent limit value and a transition of the switch element to an ON state.

3. The overcurrent protection circuit according to claim 1, wherein the drive signal for the switch element is controlled based on a result of comparing the output current with the first overcurrent limit value.

4. A switch device, comprising:
   a switch element; and
   an overcurrent protection circuit configured to monitor an output current that flows through the switch element, wherein
   the overcurrent protection circuit comprises:
      an overcurrent detection section configured to detect whether the output current that flows through the switch element is reaching a first overcurrent limit value; and
      a hiccup control section configured to start a hiccup driving operation on the switch element based on a result of the detection by the overcurrent detection section, wherein
         the hiccup driving operation includes control of a drive signal for the switch element such that a predetermined ON period and a predetermined OFF period of the switch element are periodically repeated to reduce an overcurrent limit value for the output current from the first overcurrent limit value to a second overcurrent limit value which is smaller than the first overcurrent limit value.

5. An electronic device, comprising:
   a switch device; and
   a load connected to the switch device, wherein the switch device comprises:
      a switch element; and
      an overcurrent protection circuit configured to monitor an output current that flows through the switch element, wherein the overcurrent protection circuit comprises:
         an overcurrent detection section configured to detect whether the output current that flows through the switch element is reaching a first overcurrent limit value; and
         a hiccup control section configured to start a hiccup driving operation on the switch element based on a result of the detection by the overcurrent detection section, wherein
            the hiccup driving operation includes control of a drive signal for the switch element such that a predetermined ON period and a predetermined OFF period of the switch element are periodically repeated to reduce an overcurrent limit value for the output current from the first overcurrent limit value to a second overcurrent limit value which is smaller than the first overcurrent limit value.

6. The electronic device according to claim 5, wherein the load is one of a valve lamp, a relay coil, a solenoid, a light-emitting diode, and a motor.

7. A vehicle, comprising:
   an electronic device comprising,
      a switch device; and
      a load connected to the switch device, wherein the switch device comprises:
         a switch element; and
         an overcurrent protection circuit configured to monitor an output current that flows through the switch element, wherein the overcurrent protection circuit comprises:

an overcurrent detection section configured to detect whether the output current that flows through the switch element is reaching a first overcurrent limit value; and a hiccup control section configured to start a hiccup driving operation on the switch element based on a result of the detection by the overcurrent detection section, wherein the hiccup driving operation includes control of a drive signal for the switch element such that a predetermined ON period and a predetermined OFF period of the switch element are periodically repeated to reduce an overcurrent limit value for the output current from the first overcurrent limit value to a second overcurrent limit value which is smaller than the first overcurrent limit value.

\* \* \* \* \*